United States Patent
Sudo et al.

(10) Patent No.: US 9,469,560 B2
(45) Date of Patent: Oct. 18, 2016

(54) METHOD OF MANUFACTURING VITREOUS SILICA CRUCIBLE, VITREOUS SILICA CRUCIBLE

(75) Inventors: Toshiaki Sudo, Akita (JP); Takuma Yoshioka, Akita (JP); Koichi Suzuki, Akita (JP); Shinsuke Yamazaki, Akita (JP)

(73) Assignee: JAPAN SUPER QUARTZ CORPORATION, Akita (JP)

( * ) Notice: Subject to any disclaimer, the term of this patent is extended or adjusted under 35 U.S.C. 154(b) by 213 days.

(21) Appl. No.: 13/307,316

(22) Filed: Nov. 30, 2011

(65) Prior Publication Data
US 2012/0141704 A1 Jun. 7, 2012

(30) Foreign Application Priority Data
Dec. 1, 2010 (JP) .................. 2010-268154

(51) Int. Cl.
C03B 19/09 (2006.01)
C03B 19/06 (2006.01)
C30B 11/00 (2006.01)
C30B 15/10 (2006.01)

(52) U.S. Cl.
CPC ........... C03B 19/095 (2013.01); C03B 19/066 (2013.01); C30B 11/002 (2013.01); C30B 15/10 (2013.01); Y10T 428/131 (2015.01); Y10T 428/1314 (2015.01); Y10T 428/1317 (2015.01)

(58) Field of Classification Search
CPC ..... C30B 15/10; C30B 35/002; C30B 35/00; C03B 19/095; C03B 19/066; C03B 20/00
USPC .................................. 65/17.3, 17.6
See application file for complete search history.

(56) References Cited

U.S. PATENT DOCUMENTS 3,620,702 A 11/1971 DeKalb et al.
4,632,686 A * 12/1986 Brown et al. .................. 65/17.3
(Continued)

FOREIGN PATENT DOCUMENTS

CN 1845881 10/2006
DE 4440104 5/1995
(Continued)

OTHER PUBLICATIONS

Japan Office action, dated Dec. 24, 2013 along with an english translation thereof.
(Continued)

Primary Examiner — Jodi C Franklin
(74) Attorney, Agent, or Firm — Greenblum & Bernstein, P.L.C.

(57) ABSTRACT

The present invention provides a method of manufacturing a vitreous silica crucible having a transparent layer by use of waste vitreous silica. According to the present invention, there is provided a method of manufacturing a vitreous silica crucible for manufacturing a monocrystalline or polycrystalline silicon ingot, including a process of vitrifying a silica powder sintered body having a crucible shape in the whole or part of the thickness direction by arc fusing the silica powder sintered body from the inner surface side, wherein the method further includes at least one means of (1) depressurizing the silica powder sintered body from the outer surface side during the arc fusing, and (2) forming a synthetic vitreous silica layer on the inner surface by spraying synthetic silica powder onto the inner surface of the silica powder sintered body during the arc fusing.

4 Claims, 2 Drawing Sheets

(56) References Cited

U.S. PATENT DOCUMENTS

| | | | |
|---|---|---|---|
| 5,174,801 A * | 12/1992 | Matsumura et al. | 65/17.3 |
| 5,235,611 A * | 8/1993 | Jones et al. | 373/20 |
| 5,736,206 A | 4/1998 | Englisch et al. | |
| 6,136,092 A * | 10/2000 | Sato et al. | 117/84 |
| 6,280,522 B1 * | 8/2001 | Watanabe et al. | 117/29 |
| 2002/0170492 A1 * | 11/2002 | Kubo et al. | 117/208 |
| 2003/0012899 A1 * | 1/2003 | Kemmochi et al. | 428/34.6 |
| 2003/0041623 A1 * | 3/2003 | Werdecker et al. | 65/17.6 |
| 2003/0159646 A1 * | 8/2003 | Watanabe | 117/18 |
| 2004/0025783 A1 * | 2/2004 | Ohama et al. | 117/19 |
| 2004/0040497 A1 * | 3/2004 | Kemmochi et al. | 117/200 |
| 2004/0072007 A1 * | 4/2004 | Kemmochi et al. | 428/544 |
| 2004/0116269 A1 * | 6/2004 | Harada et al. | 501/54 |
| 2004/0118158 A1 * | 6/2004 | Schwertfeger et al. | 65/33.2 |
| 2005/0120945 A1 | 6/2005 | Hansen | |
| 2005/0235907 A1 * | 10/2005 | Ohama et al. | 117/200 |
| 2007/0051297 A1 | 3/2007 | Kemmochi et al. | |
| 2007/0082149 A1 | 4/2007 | Linnot et al. | |
| 2008/0153688 A1 * | 6/2008 | Borens et al. | 501/12 |
| 2008/0196448 A1 * | 8/2008 | Borens et al. | 65/17.1 |
| 2009/0084308 A1 * | 4/2009 | Kishi et al. | 117/13 |
| 2009/0249999 A1 * | 10/2009 | Roligheten et al. | 117/223 |
| 2009/0266110 A1 * | 10/2009 | Werdecker et al. | 65/60.5 |
| 2010/0005836 A1 * | 1/2010 | Kishi et al. | 65/124 |
| 2010/0006022 A1 * | 1/2010 | Kishi et al. | 117/13 |
| 2010/0115996 A1 * | 5/2010 | Werdecker et al. | 65/33.4 |
| 2010/0162767 A1 * | 7/2010 | Shimazu | 65/348 |
| 2010/0178374 A1 * | 7/2010 | Yoshioka et al. | 425/404 |
| 2010/0192841 A1 * | 8/2010 | Tsujimoto et al. | 117/208 |
| 2010/0229599 A1 | 9/2010 | Fujita et al. | |
| 2011/0030612 A1 * | 2/2011 | Abe et al. | 117/214 |
| 2012/0137732 A1 * | 6/2012 | Sudo et al. | 65/17.3 |
| 2012/0141704 A1 * | 6/2012 | Sudo et al. | 428/34.5 |
| 2013/0152483 A1 * | 6/2013 | Matsui et al. | 51/309 |

FOREIGN PATENT DOCUMENTS

| | | |
|---|---|---|
| EP | 0463543 | 1/1992 |
| JP | 08-283065 | 10/1996 |
| JP | 11-116388 | 4/1999 |
| JP | 2000-344535 | 12/2000 |
| JP | 2004-131317 | 4/2004 |
| JP | 2006-273666 | 10/2006 |
| JP | 2007-153625 | 6/2007 |
| JP | 2007-191393 | 8/2007 |
| JP | 2010-111524 | 5/2010 |
| KR | 20000050186 | * 8/2000 |

OTHER PUBLICATIONS

Taiwan Office action, dated Sep. 4, 2013 along with an english translation thereof.
China Office action, mail date is Jan. 3, 2014.

* cited by examiner of approx. 300 μm and using the rotating
METHOD OF MANUFACTURING VITREOUS SILICA CRUCIBLE, VITREOUS SILICA CRUCIBLE

CROSS-REFERENCE TO RELATED APPLICATION

This application is related to Japanese Patent Application No. 2010-268154 filed on Dec. 1, 2010, whose priority is claimed and the disclosure of which is incorporated by reference in its entirety.

BACKGROUND OF THE INVENTION

1. Field of the Invention

The present invention relates to a method of manufacturing a vitreous silica crucible, and a vitreous silica crucible.

2. Description of the Related Art

In one example, a method of manufacturing a vitreous silica crucible includes a silica powder layer forming process for forming a silica powder layer by depositing silica powder having an average particle diameter of approx. 300 um on the inner surface of a rotating mold, and an arc fusing process for arc fusing the silica powder layer while depressurizing the silica powder layer from the mold side (hereinafter, this method is referred to as "rotating mold pressure reduction method"). Furthermore, in order to uniformize the height of the crucible after the arc fusing process, a cutting-off process for cutting off the upper end portion of the crucible is carried out.

In manufacturing a two-layer structure crucible having a transparent vitreous silica layer substantially not containing bubbles (hereinafter, referred to as "transparent layer") on the inner side of the crucible, and a vitreous silica layer containing bubbles (hereinafter, referred to as "bubble-containing layer") on the outer side of the crucible, a transparent layer is formed by removing bubbles by depressurizing the silica powder layer at the beginning of the arc fusing process, and thereafter, a bubble-containing layer containing residual bubbles is formed by weakening depressurization.

In manufacturing a crucible, the cutting-off process is carried out to all crucibles, and a large amount of waste vitreous silica is generated in the process. Furthermore, the crucible obtained in the arc fusing process is sometimes not compliance with the specifications, and in case the crucible cannot be modified to meet the specifications, the crucible is usually scrapped to generate waste vitreous silica.

Related references to the present invention are JP-A-2000-344535, JP-A-2004-131317, and JP-A-h8-283065.

SUMMARY OF THE INVENTION

The waste vitreous silica generated in the manufacturing process of a crucible have very high purity, and thus the present inventors have tried to manufacture the above-mentioned two-layer structure crucible by pulverizing this waste vitreous silica into silica powder having an average particle diameter of approx. 300 um and using the rotating mold pressure reduction method. However, even though the silica powder layer was strongly depressurized during the arc fusing, bubbles remained and a transparent layer was not formed.

The present invention has been made in view of these circumstances, and provides a method of manufacturing a vitreous silica crucible having a transparent layer by use of waste vitreous silica.

According to the present invention, there is provided a method of manufacturing a vitreous silica crucible for manufacturing a monocrystalline or polycrystalline silicon ingot, comprising a process of vitrifying a silica powder sintered body having a crucible shape in the whole or part of the thickness direction by arc fusing the silica powder sintered body from the inner surface side, wherein the method further comprises at least one means of (1) depressurizing the silica powder sintered body from the outer surface side during the arc fusing, and (2) forming a synthetic vitreous silica layer on the inner surface side by spraying synthetic silica powder onto the inner surface of the silica powder sintered body during the arc fusing.

The inventors have investigated the reason why a transparent layer is not formed when a crucible is manufactured by use of silica powder obtained by pulverizing waste vitreous silica, and found out that the waste vitreous silica contains a large amount of bubbles, and these bubbles are not completely removed even when the waste vitreous silica was pulverized into powder having an average particle diameter of approx. 300 μm, and thus the bubbles remains inside the individual particles of the silica powder, and found out that the residual bubbles prohibits the formation of a transparent layer.

Next, the waste vitreous silica was pulverized further finely so as to obtain silica powder having an average particle diameter of approx. 50 μm so that the bubbles did not remain inside the particles, and the powder was used for manufacturing a crucible by use of the rotating mold pressure reduction method. However, because the silica powder was too small, the silica powder hovers in the process of depositing the silica powder on the mold inner surface, and thus it was difficult to form a silica powder layer having uniform thickness. Furthermore, even when the silica powder was deposited on the mold inner surface, the silica powder was blown off by shock wave of the arc in particular at the portion just under the arc.

In such circumstances, the present inventors have found out that it is possible to form a transparent layer substantially not containing bubbles on the crucible inner surface by manufacturing a silica powder sintered body by use of silica powder obtained by pulverizing waste vitreous silica, and vitrifying the silica powder sintered body in the whole or part of the thickness direction by arc fusing the silica powder sintered body from the crucible inner surface side while depressurizing the silica powder sintered body from the crucible outer surface side. Furthermore, the present inventors have found out that that it is possible to form a transparent layer substantially not containing bubbles on the crucible inner surface by spraying synthetic silica powder onto the inner surface of the silica powder sintered body.

According to the present invention, it is possible to form a transparent layer by a very simple way of arc fusing a silica powder sintered body under reduced pressure or spraying synthetic silica powder during the arc fusing, and thus it is possible to easily manufacture a crucible having a transparent layer on the inner surface by use of waste vitreous silica.

DESCRIPTION OF THE PREFERRED EMBODIMENTS

Hereinafter, with reference to FIGS. 1(a) to 1(c), FIG. 2, and FIG. 3, a method of manufacturing a vitreous silica crucible of one embodiment of the present invention will be explained.

A method of manufacturing a vitreous silica crucible for manufacturing a monocrystalline or polycrystalline silicon ingot of the present embodiment, comprising a process of vitrifying the silica powder sintered body 3 having a crucible shape in the whole or part of the thickness direction by arc fusing the silica powder sintered body 3 from the inner surface side, wherein the method further comprising at least one means of (1) depressurizing the silica powder sintered body 3 from the outer surface side during the arc fusing, and (2) forming a synthetic vitreous silica layer 5 on the inner surface side by spraying synthetic silica powder onto the inner surface of the silica powder sintered body 3 during the arc fusing.

Hereinafter, respective components are explained in detail.

(1) Silica Powder Sintered Body 3

Figure 1A:
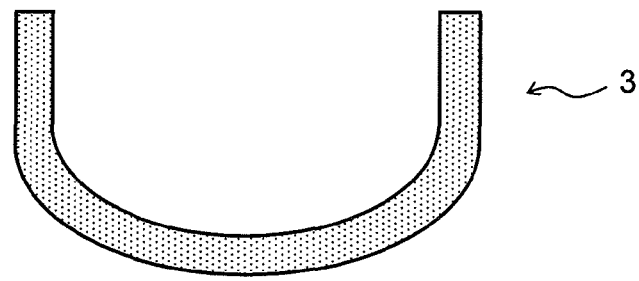
FIG. 1(a) is a sectional view showing structure of a silica powder sintered body before arc fusing, for manufacturing a vitreous silica crucible of one embodiment of the present invention.

The silica powder sintered body 3 used in the method of the present embodiment has a crucible shape as shown in FIG. 1(a). FIG. 1(a) shows a silica powder sintered body having a round-bottom crucible shape 3, but the silica powder sintered body may have a flat-bottom crucible shape. Furthermore, the method of the present embodiment is directed to either a crucible for pulling a single crystal silicon ingot or a crucible for manufacturing a polycrystalline silicon ingot, and the shape viewed from above of a crucible may be circular or square.

The silica powder sintered body 3 is obtained by sintering silica powder, and the diameter of the silica powder or the method of manufacturing the sintered body is not in particular limited. An average particle diameter of the silica powder is preferably 1 to 250 μm. When the diameter is too large, the individual particles of the silica powder are likely to contain bubbles, and when the diameter is too small, the pulverization takes a large amount of labor and time, and thus it is not preferable.

One aspect of the present invention is to utilize waste vitreous silica, and thus the waste vitreous silica is preferred to be manufactured by use of silica powder obtained by pulverizing waste vitreous silica. The waste vitreous silica includes, but not limited to, for example, a portion cut off in the rim cutting process for cutting off an upper portion of a crucible, and vitreous silica of a crucible scrapped without being shipped when the crucible does not meet the specifications and the modification is not possible. In addition, the waste vitreous silica also includes vitreous silica generated in the manufacturing process of a crucible but not shipped as a product.

Furthermore, when the particle diameter of the silica powder is too small, the volume of the space inside the sintered body (porosity) is also too small, and thus when the sintered body is depressurized from the outer surface side during the arc fusing, the effect of the depressurization from the outer surface side of the crucible during the arc fusing is difficult to reach the inner surface side of the crucible. The average particle diameter of the silica powder is, for example, 1, 5, 10, 20, 40, 60, 80, 100, 120, 140, 160, 180, 200, 250 μm, and it can be in the range between two values of the values exemplified here.

By the way, "particle size" is, in general, as shown in the section of the term definition of "Test Powder and Test Particles" in JIS Z 8901, a size represented by the aperture size of a test sieve used for the measurement in the screening method, a size represented by the Stokes equivalent diameter obtained by the sedimentation method, a size represented by a circle equivalent diameter obtained in the microscope method, a size represented by a sphere equivalent diameter obtained by the light scattering method, or a size represented by a sphere equivalent diameter obtained by the electrical resistance test, and is also referred to as "particle diameter". However, in the present specification, the particle size distribution is measured by use of the laser diffraction/scattering measurement method using laser light as a light source.

The principle is to utilize a phenomenon that when particles are irradiated with light, the intensity and pattern of the light scattered by each particle changes depending on the particle diameter (Mie scattering). When the particle diameter is large, the intensity of the scattered light in all direction is strong, and the intensity of the forward scattered light is in particular strong. As the particle diameter decreases, the overall scattered light intensity weakens, and the forward-scattered light is only weakly detected. Therefore, when the particle diameter is large, the forward-scattered light collected by a convex lens generates a diffraction pattern on the focal plane. The brightness and size of the diffracted light depends on the particle size (particle diameter). Therefore, by use of information from the scattered light, the particle diameter can be obtained easily.

In contrast, when the particle diameter decreases, the intensity of the forward-scattered light weakens, and thus it is difficult to detect the light by use of a detector mounted in front. However, as the scattering pattern of the side-way and back scattered light changes depending on the particle diameter, it is possible to determine the particle diameter by measuring these. The measurement result is compared with a spherical particle exhibiting a scattering pattern equivalent to the scattering pattern for the measured particle, and the result is outputted as a particle size distribution. Therefore, for example, when a measured particle exhibits a diffracted/scattered light pattern equivalent to a sphere having a diameter of 1 μm, the diameter of the particle is determined to be 1 μm irrespective of the shape. The diameter is different from that determined by other measurement methods using visual or image analysis, such as "Feret diameter" corresponding to the length in a specific axis direction of randomly oriented particles, "equivalent diameter" corresponding to the size of a particle of an ideal shape (usually a circle) which has the same area as the projected area of the particle, or an aspect ratio representing the ratio of the long axis and short axis. Furthermore, the "average particle diameter" represents a particle diameter at an integrated value of 50% in the obtained particle size distribution.

Preferably, the silica powder sintered body 3 can be manufactured by mixing silica powder obtained by pulverizing vitreous silica with a dispersion medium to obtain slurry, and forming this into a crucible shape, followed by firing. A dispersion medium is not in particular limited as long as the dispersion medium can be used to prepare slurry from the silica powder. The dispersion medium is preferably pure water so as not to contain impurities into the sintered body. Furthermore, a dispersant and a binder may be added as necessary. The dispersant and the binder are preferably removable by the heat treatment at the firing temperature.

The firing temperature is not in particular limited as long as a sintered body is formed, but is preferred to be 800 to 1500 deg. C. When the firing temperature is too low, the sintered body is not formed, and when the firing temperature is too high, the sintered body can be vitrified. The firing temperature is, for example, 800, 900, 1000, 1100, 1200, 1300, 1400, 1500 deg. C., and it may be in the range between two values of the values exemplified here. The firing time is not in particular limited as long as the time is sufficient to form a sintered body, and for example, 0.5 to 100 hours, and more specifically, for example, 0.5, 1, 3, 5, 10, 20, 30, 40, 50, 100 hours, and it can be in the range between two values of the values exemplified here. When the firing time is too short, the sintered body is not properly formed, and when the firing time is too long, the production efficiency can drop.

The method of forming the slurry into a crucible shape is not in particular limited, but the slip casting method is preferable, and by use of this method, a large-size crucible can be relatively easily manufactured. The slip casting method is known as a method of forming a ceramic sintered body. Usually, a mold made of a material having high water absorbability such as plaster is used, and slurry (suspension of ceramic powder, also referred to as "slip") is injected into the mold, and water in the slurry is absorbed by the mold to solidify the slurry. The obtained molded body is subjected to a degreasing process, and thereafter fired to produce a final product. This method is in general appropriate to form a molded body having a complex shape, but requires long time to manufacture a molded body having a thick wall. In order to manufacture a molded body having a thick wall, the compression molding method where slip cast molding is carried out while slurry is subjected to a constant pressure is used. According to the slip cast compression molding method, slurry is forcedly dewatered, and thus a molded body having a relatively thick wall can be manufactured.

The porosity of the silica powder sintered body 3 is not in particular limited, but, for example, 1 to 30%. As the porosity decreases, the effect of the depressurization from the outer surface side of the crucible during the arc fusing becomes more difficult to reach the inner surface side of the crucible, but the strength of the silica powder sintered body 3 is enhanced. The porosity can be adjusted by changing the particle diameter of silica powder. Furthermore, the porosity can also be adjusted by changing the mixing ratio of a plurality of kinds of silica powder having different particle diameters. The porosity is, for example, 1, 2, 5, 10, 15, 20, 25, 30%, and it can be in the range between two values of the values exemplified here.

(2) Arc Fusing

Figure 1B:
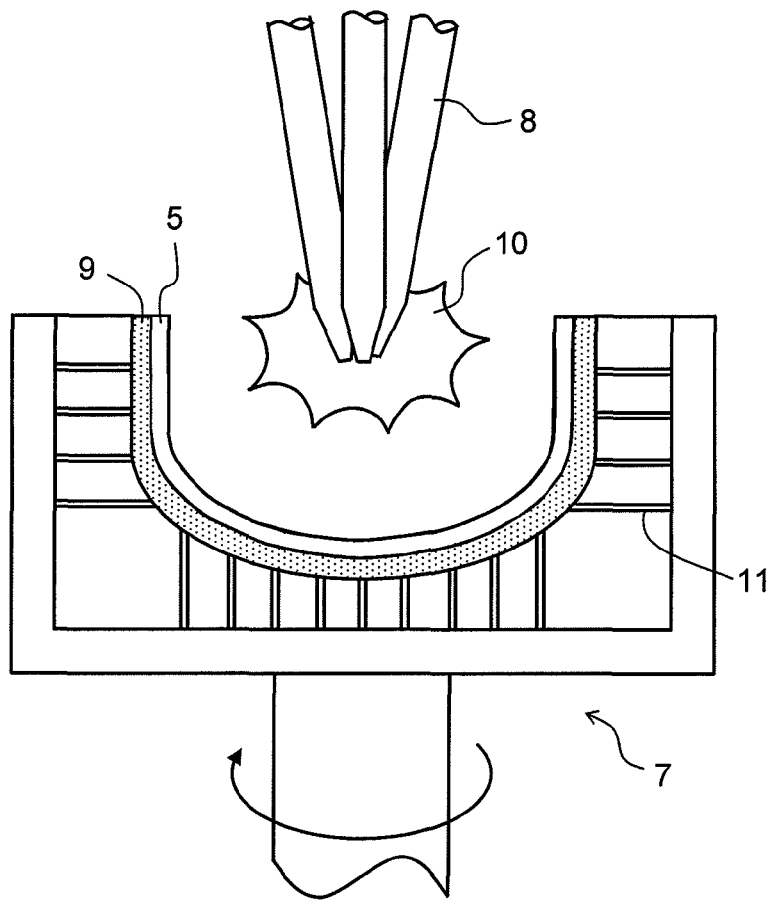
FIG. 1(b) is a sectional view showing a state of arc fusing a sintered body of FIG. 1(a).
Figure 1C:
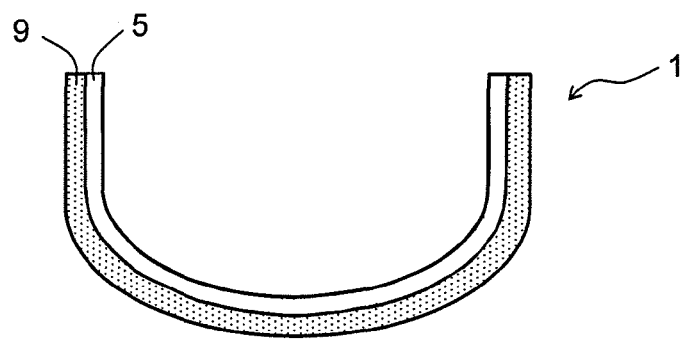
FIG. 1(c) is a sectional view showing structure of a vitreous silica crucible obtained as a result of arc fusing of FIG. 1(b).

As shown in FIG. 1(b), the arc fusing process is carried out by mounting the silica powder sintered body 3 on the mold 7, and, in that state, vitrifying the silica powder sintered body 3 in the whole or part of the thickness direction by arc fusing the silica powder sintered body 3 from the crucible inner surface side. By this process, there can be obtained a vitreous silica crucible 1 having a vitreous silica layer 5 formed by fusing the inner surface of the silica powder sintered body 3 having a crucible shape.

The arc fusing can be carried out by generating arc discharge 10 between carbon electrodes 8 while rotating the mold 7. The thickness of the silica powder sintered body 3 fused in this process can be adjusted by changing the arc fusing time. The arc fusing can be carried out for sufficiently long time to vitrify the entire silica powder sintered body 3 to form a vitreous silica layer 5, or can be carried out for relatively short time so that unfused sintered body layer 9 remains in the crucible outer layer. The unfused sintered body layer 9 is relatively strong, and thus the strength of the crucible 1 can be enhanced by providing the unfused sintered body layer 9 in the outer layer. The thickness of the unfused sintered body layer 9 is, for example, 30% to 90% of the wall thickness of the crucible 1, and is preferred to be 30 to 60% of the wall thickness of the crucible 1, and more specifically, for example, 30, 40, 50, 60, 70, 80, 90% of the wall thickness of the crucible 1, and it can be in the range between any two of the values exemplified here. When the thickness is too small, the effect of enhancing the strength is small, and when the thickness is too large, the thickness of the vitreous silica layer 5 on the inner surface is too small.

The arc fusing temperature on the inner surface of the silica powder sintered body 3 is preferred to be 1700 to 2600 deg. C. When the arc fusing temperature is too low, the sintered body 3 is difficult to be vitrified, and when the temperature is too high, energy waste is large. The arc fusing temperature is, for example, 1700, 1800, 1900, 2000, 2100, 2200, 2200, 2300, 2400, 2500, 2600 deg. C., and it can be in the range between two values of the values exemplified here.

By the way, the silica powder sintered body 3 is made of vitreous silica, and thus when the silica powder sintered body 3 before the arc fusing is subjected to the X-ray diffraction measurement, no peak appears, and thus the silica powder sintered body 3 is amorphous. In contrast, when the vitreous silica layer 5 formed by the arc fusing was subjected to the X-ray diffraction measurement, peaks indicating the presence of crystals appeared. This result indicates that the vitreous silica layer 5 was at least partially crystallized without addition of a mineralizing element such as Ba. When more closely investigated, it was found that the vitreous silica layer 5 was partially turned white, and the white portion was crystalline. In general, crystalline silica has higher strength than vitreous silica, and thus according to the method of the present embodiment, it is possible to manufacture a strong crucible.

During the arc fusing, the silica powder sintered body is depressurized from the crucible outer surface side, or synthetic silica powder is sprayed on the inner surface of the silica powder sintered body 3. By employing at least one means of these means, it is possible to easily manufacture a crucible having a transparent layer on the inner surface side.

(2-1) Depressurization

The mold 7 is provided with a number of ventilation holes 11, and it is possible to depressurize the silica powder sintered body 3 from the crucible outer surface side through the ventilation holes 11. The pressure of the depressurization is preferred to be −50 kPa or more and less than −95 kPa. When the silica powder sintered body is fused under such level of depressurization, the bubbles contained in the fused portion is immediately removed, and a transparent layer substantially not containing bubbles (having a bubble content rate of less than 0.5%) can be formed. In the present specification, the value of the pressure is the value with reference to the ambient air pressure.

When a crucible is manufactured by use of the rotating mold pressure reduction method as mentioned in the Description of Related Art, the lower limit of the particle diameter of silica powder is approx. 100 μm, and when the diameter is smaller than that, the powder hovers in forming a silica powder layer, it is not possible to stably form a silica powder layer. Furthermore, even when a silica powder layer can be formed, the silica powder is blown off by shock wave of the arc in particular at the portion just under the arc. Therefore, the particle diameter of the silica powder needs to be larger than a certain size, and thus bubbles are confined in the individual particles of the silica powder. Then, the bubbles are contained in a vitreous silica layer formed after the arc fusing. On the other hand, according to the method of the present embodiment, it is easy to form a sintered body by use of silica powder obtained by pulverizing the material into particles having a size which is too small for the particle to contain bubbles in the individual particles, and thus it is easy to remove bubbles from the individual particles, and therefore it is possible to form a transparent layer substantially not containing bubbles.

Further more, after forming the transparent layer, it is possible to form a bubble-containing layer having a bubble content rate of 0.5% or more and less than 50% on the outer side of the transparent layer by adjusting the pressure of the depressurization to 0 kPa or more and less than −10 kPa. In the present specification, the bubble content rate refers to the ratio ($w_2/w_1$) of the volume ($w_2$) occupied by bubbles in a unit volume ($w_1$) of the crucible.

(2-2) Formation of Synthetic Vitreous Silica Layer

Figure 2:
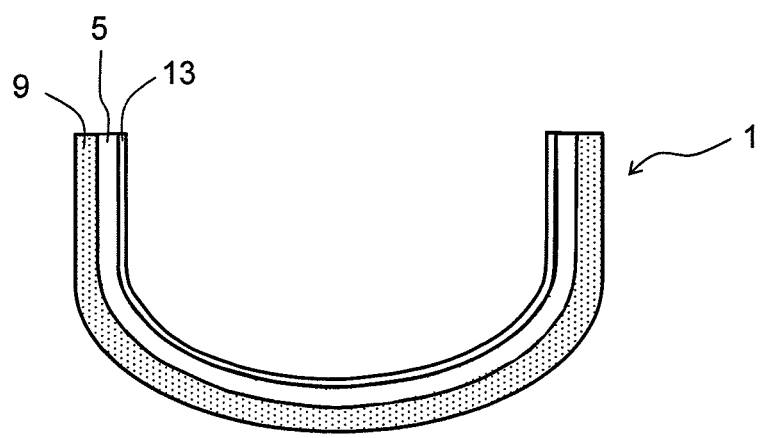
FIG. 2 is a sectional view showing structure of a vitreous silica crucible obtained in the case where a sintered body of FIGS. 1(a) to 1(c) is subjected to arc fusing while spraying synthetic silica powder thereto.

It is preferred to include a process of forming a synthetic vitreous silica layer (Hereinafter referred to as "synthetic layer.") on the crucible inner surface by spraying synthetic silica powder (not shown) on the inner surface of the silica powder sintered body 3 during the arc fusing instead of or in conjunction with arc fusing the sintered body 3 under reduced pressure. In this case, as shown in FIG. 2, a crucible 1 having a synthetic layer 13 on the inner surface side can be obtained. Synthetic silica powder is silica powder manufactured by chemical synthesis, such as gas phase oxidation (dry synthesis) of silicon tetrachloride ($SiCl_4$), or hydrolysis (sol-gel method) of silicon alkoxide ($Si(OR)_4$).

When synthetic silica powder is sprayed onto the heated portion of the inner surface of the crucible 1 heated by the heat of the arc discharge, the synthetic silica powder is fused immediately after the powder is attached to the wall to form a synthetic layer 13. The silica powder sintered body 3 is usually manufactured by use of waste vitreous silica, and thus the vitreous silica layer formed by fusing the silica powder sintered body 3 can have low purity. According to the present embodiment, the inner surface of the crucible 1 is covered with high purity synthetic layer, and thus it is possible to suppress mixing of impurities into silicon melt.

It is preferred to start to spray synthetic silica powder after the inner surface of the silica powder sintered body has started to be fused. When the spray is started before the inner surface starts to be fused, the sprayed synthetic powder does not attach to the sidewall, and move to the bottom of the crucible along the wall. This causes the synthetic layer at the bottom portion to be thicker than necessary.

Figure 3:
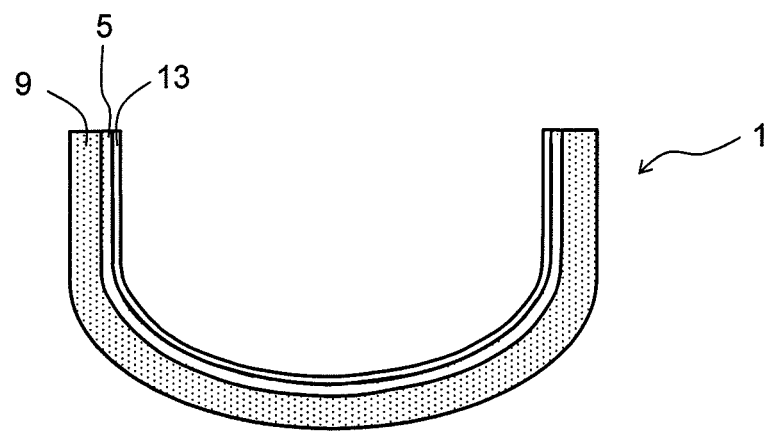
FIG. 3 is a sectional view showing structure of a vitreous silica crucible obtained in the case where spraying synthetic silica powder is started just after starting arc fusing a sintered body of FIGS. 1(a) to 1(c), and the arc fusing is stopped just after a synthetic vitreous silica layer is formed.

Furthermore, in another embodiment, spraying the synthetic silica powder is started just after the inner surface of the silica powder sintered body has started to be fused, and the arc fusing is terminated just after a synthetic layer having a desired thickness has been formed. When the synthetic layer is formed in such method, the ratio of an unfused portion of the sintered body is relatively large. According to this method, as shown in FIG. 3, it is possible to obtain a crucible 1 having, from the outer surface side of the crucible, a relatively thick unfused sintered body layer 9, a relatively thin vitreous silica layer 5, and a synthetic layer 13.

As the thickness of the unfused sintered body layer 9 increases, the strength of the crucible 1 increases. Therefore, the thickness of the unfused sintered body layer 9 is preferably 30% or more of the wall thickness of the crucible (the total thickness of the unfused sintered body layer 9, the vitreous silica layer 5, and the synthetic layer 13), and more specifically, for example, 30, 40, 50, 60, 70, 80, 90% of the wall thickness of the crucible, and it can be above any one value of the values exemplified here or can be in the range between two values of the values exemplified here. From the viewpoint of the strength, there is no upper limit for the thickness of the unfused sintered body layer 9. However, when the synthetic layer 13 is formed, the silica powder sintered body is inevitably fused to some extent, and thus in view of the easiness of manufacturing, the thickness of the unfused sintered body layer 9 is preferred to be 60% or less of the wall thickness of the crucible.

EXAMPLE

1. Formation of Vitreous Silica Layer

A flat-bottom silica powder sintered body having an outer diameter of 470 mm, a height of 345 mm, and a wall thickness of 15 mm was manufactured, and the silica powder sintered body was mounted on a mold, and the silica powder sintered body was arc fused from the crucible inner surface side while depressurizing the silica powder sintered body from the mold side, and the arc fusing was terminated when the half of the silica powder sintered body in the thickness direction was fused, followed by cooling to form a vitreous silica layer. The arc fusing temperature was about 2200 deg. C., and the pressure of the depressurization was −70 kPa. As a result, it was observed that a vitreous silica layer substantially not containing bubbles was formed on the inner side of the crucible.

Next, the sintered body before the arc fusing, and the formed vitreous silica layer were subjected to X-ray diffraction measurement. As a result, it was found out that no peaks appeared in the measurement of the sintered body before the arc fusing, and thus it was amorphous. In contrast, it was found out that peaks indicating the presence of crystals appeared for the measurement in the white portion of the vitreous silica layer, and thus the vitreous silica layer was at least partially crystallized. This crystallization is considered to contribute to improvement of the crucible strength.

2. Formation of Synthetic Layer

A flat-bottom silica powder sintered body having an outer diameter of 470 mm, a height of 345 mm, and a wall thickness of 15 mm was manufactured, and the silica powder sintered body was mounted on a mold, and the silica powder sintered body was arc fused from the crucible inner surface side. Just after the inner surface of the silica powder sintered body had started to be fused, spraying the synthetic silica powder was started, and the arc fusing was terminated after a synthetic layer having a thickness of 1 mm had been formed. The arc fusing temperature was about 2200 deg. C. As a result, it was observed that a transparent vitreous silica layer was formed on the inner side of the crucible. Furthermore, the thickness of the unfused sintered body was approx. 50% of the entire wall thickness of the crucible.

EXPLANATION OF REFERENCE SYMBOL

1: Crucible
3: Silica Powder Sintered Body

5: Synthetic Vitreous Silica Layer
7: Mold
8: Carbon Electrode
9: Unfused Sintered Body Layer
10: Arc Discharge
11: Ventilation Hole

What is claimed is:

1. A method of manufacturing a vitreous silica crucible for manufacturing a monocrystalline or polycrystalline silicon ingot, comprising:
    vitrifying an amorphous silica powder sintered body having a crucible shape in at least part of a thickness direction by arc fusing the amorphous silica powder sintered body from an inner surface side;
    depressurizing the amorphous silica powder sintered body from an outer surface side during the arc fusing; and
    forming a synthetic vitreous silica layer on the inner surface side by spraying synthetic silica powder onto an inner surface of the amorphous silica powder sintered body during the arc fusing, wherein:
        the spraying of the synthetic silica powder is started just after the inner surface side of the amorphous silica powder sintered body has started to be fused, and the arc fusing is terminated when half of the amorphous silica powder sintered body in a thickness direction is fused,
        the arc fusing is carried out such that a temperature on the inner surface of the amorphous silica powder sintered body is 1700 to 2600 degrees C.,
        the amorphous silica powder sintered body is manufactured by mixing silica powder obtained by pulverizing vitreous silica with a dispersion medium to obtain a slurry, and then forming the slurry into a crucible shape, followed by firing,
        the vitreous silica is waste vitreous silica generated in a manufacturing process of a vitreous silica crucible, and
        the firing is carried out at 800 to 1500 degrees C.

2. The method of claim 1, wherein an average particle diameter of the silica powder defining the amorphous silica powder sintered body is 1 to 250 μm.

3. The method of claim 1, wherein the forming of the synthetic vitreous silica layer comprises forming a transparent vitreous silica layer.

4. The method of claim 3, wherein the transparent vitreous silica layer substantially does not contain bubbles.

* * * * *